(12) United States Patent
Mc Carty et al.

(10) Patent No.: US 7,432,039 B2
(45) Date of Patent: Oct. 7, 2008

(54) METHOD FOR SIMULTANEOUS PATTERNING OF FEATURES WITH NANOMETER SCALES GAPS

(75) Inventors: Gregory S. Mc Carty, State College, PA (US); Jeffrey M. Catchmark, Bellfonte, PA (US); Guy P. Lavallee, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 629 days.

(21) Appl. No.: 10/979,023

(22) Filed: Nov. 1, 2004

(65) Prior Publication Data

US 2005/0106383 A1 May 19, 2005

Related U.S. Application Data

(60) Provisional application No. 60/516,721, filed on Nov. 3, 2003.

(51) Int. Cl.
*G03F 7/00* (2006.01)
*H01L 51/40* (2006.01)

(52) U.S. Cl. ...................... 430/311; 430/313
(58) Field of Classification Search ................ 430/313, 430/311
See application file for complete search history.

(56) References Cited

U.S. PATENT DOCUMENTS

| 7,015,062 | B1 * | 3/2006 | Weiss et al. | ............... 438/99 |
| 2004/0110350 | A1 * | 6/2004 | Pang et al. | ............... 438/299 |

OTHER PUBLICATIONS

Hatzor et al., "Molecular Rulers for Scaling Down Nanostructures", Science, vol. 291, pp. 1019-1020 (2001).
McCarty, Gregory S., Molecular Lithography for Wafer Scale Fabrication of Molecular Junctions:, currently under review.
McCarty, Gregory S., "Charge Transport of Molecular Films Elucidated by Nanofabricated Junctions", published Aug. 2004.

* cited by examiner

*Primary Examiner*—Mark F. Huff
*Assistant Examiner*—Caleen O Sullivan
(74) *Attorney, Agent, or Firm*—McKee, Voorhees & Sease, P.L.C.

(57) ABSTRACT

A method of fabricating a pattern on a surface of a substrate includes applying at least one non-molecular lithographic technique with at least one molecular lithographic technique to simultaneously define a size and shape of at least one of the features of the pattern. The pattern includes a nanoscale gap between features, the gap having a width defined by the thickness of one or more molecular layers used in one of the molecular lithographic techniques.

20 Claims, 3 Drawing Sheets

METHOD FOR SIMULTANEOUS PATTERNING OF FEATURES WITH NANOMETER SCALES GAPS

CROSS-REFERENCE TO RELATED APPLICATIONS

This application is a conversion of U.S. Provisional Application No. 60/516,721, filed Nov. 3, 2003, entitled Method for Simultaneous Patterning of Features with Nanometer Scale Gaps, herein incorporated by reference in its entirety.

BACKGROUND OF THE INVENTION

The present invention relates to surface patterning techniques that are useful for fabricating micron and nanometer scale systems. Of primary importance in the fabrication of micron and nanometer scale structures and devices is the ability to pattern surfaces quickly and inexpensively with the required resolution and a high degree of accuracy. A variety of lithographic techniques have been developed to pattern surfaces. Conventional lithographic techniques include photolithography, photolithography utilizing a UV stepper, direct write electron beam lithography and imprint lithography. Though each of these techniques has its strengths and weaknesses, none of these techniques has demonstrated straight forward, inexpensive, efficient patterning of substrates with features or a resolution of less than 50 nm.

In the last few years various systems and techniques have used molecules as starting materials. These techniques have provided for the patterning of surfaces utilizing thin molecular films. These techniques include a series of methods that utilize single layer and multiple layer molecular films as resists for patterning. These molecular resist based methodologies have demonstrated inexpensive patterning of surfaces with resolutions on the order of single nanometers and upward.

Despite these advantages of using molecular films, new methods of patterning surfaces are needed. Therefore, it is a primary object, feature, or advantage of the present invention to improve over the state of the art.

It is a further object, feature, or advantage of the present invention to use films of a single molecule in thickness for patterning a surface.

Another object, feature, or advantage of the present invention is to use films of a single molecule in thickness to fabricate useful devices with dimensions from the order of a few nanometers through the millimeter size scale.

Yet another object, feature, or advantage of the present invention is to use films of a single molecule in thickness in the creation of structures that can be used in diverse applications in various fields, such as, but not limited to electronics, optoelectronics, biological and chemical sensing, drug discovery, and chemical synthesis.

Yet another object, feature, or advantage of the present invention is to pattern a surface using methodologies that are temporally and financially inexpensive.

A further object, feature, or advantage of the present invention is to pattern a surface using methodologies that are conducive to being used in manufacturing.

A still further object, feature, or advantage of the present invention is to pattern a surface using methodologies that can be used to form structures with accurate nanometer scale dimensions.

One or more of these and/or other objects, features, or advantages of the present invention will become apparent from the specification and claims that follow.

BRIEF SUMMARY OF THE INVENTION

The present invention discloses a method for simultaneously patterning a nanometer scale gap between two features while defining the feature shapes. Specifically, feature shapes are defined using two patterning steps. These patterning steps can be implemented using a variety of lithographic techniques, including, but not limited to, electron beam lithography, photolithography, imprint lithography and microcontact printing. A gap is simultaneously formed between these two features by the addition of a single molecular layer or multiple molecular layers.

According to one aspect of the present invention, a method to simultaneously pattern a nanoscale gap between a first feature and a second feature while defining the shape of the second feature is disclosed. In this method a first feature of a first material is formed on the surface of the substrate. Next, resist is applied to a portion of the first feature while leaving a second portion of the first feature not covered by the resist. Then, at least one molecular layer is applied to the second portion of the first feature not covered by the resist. Next, a second material is deposited. Then the resist and the at least one molecular layer is removed to result in a second feature formed from the second material and separated from the first feature by the nanoscale gap, the nanoscale gap having a width defined by a thickness of the at least one molecular layer.

According to another aspect of the present invention a device constructed by one of the methods of the present invention. The device includes a substrate surface having a pattern. The pattern includes a plurality of features formed by applying at least one non-molecular lithographic technique with at least one molecular lithographic technique to simultaneously define a size and shape of at least one of the features of the pattern. The plurality of features includes a first feature formed by one of the at least one non-molecular lithographic technique and a second feature formed by one of the at least one molecular lithographic technique and a nanoscale gap between the first feature and the second feature wherein the nanoscale gap has a width defined by and corresponding to a thickness of at least one molecular layer used by the one of the at least one molecular lithographic technique.

DETAILED DESCRIPTION OF THE PREFERRED EMBODIMENT

The ability to pattern a surface with very high resolution is very important for the fabrication of structures and devices. The method of the present invention uses a combination of molecular and non-molecular or conventional lithographic techniques (e.g. photolithography, direct write electron beam lithography, microcontact printing and/or imprint lithography) to form useful devices with dimensions on the order of a few nanometers through the millimeter size scale. The simultaneous patterning methodology of the instant invention is both straightforward temporally and financially inexpensive. Accordingly, the instant method is manufacturable and can be used to form structures with accurate nanometer scale dimensions. The present invention may be used in connection with the fields of electronics, optoelectronics, biological and chemical sensing, drug discovery and chemical synthesis.

Figure 1:
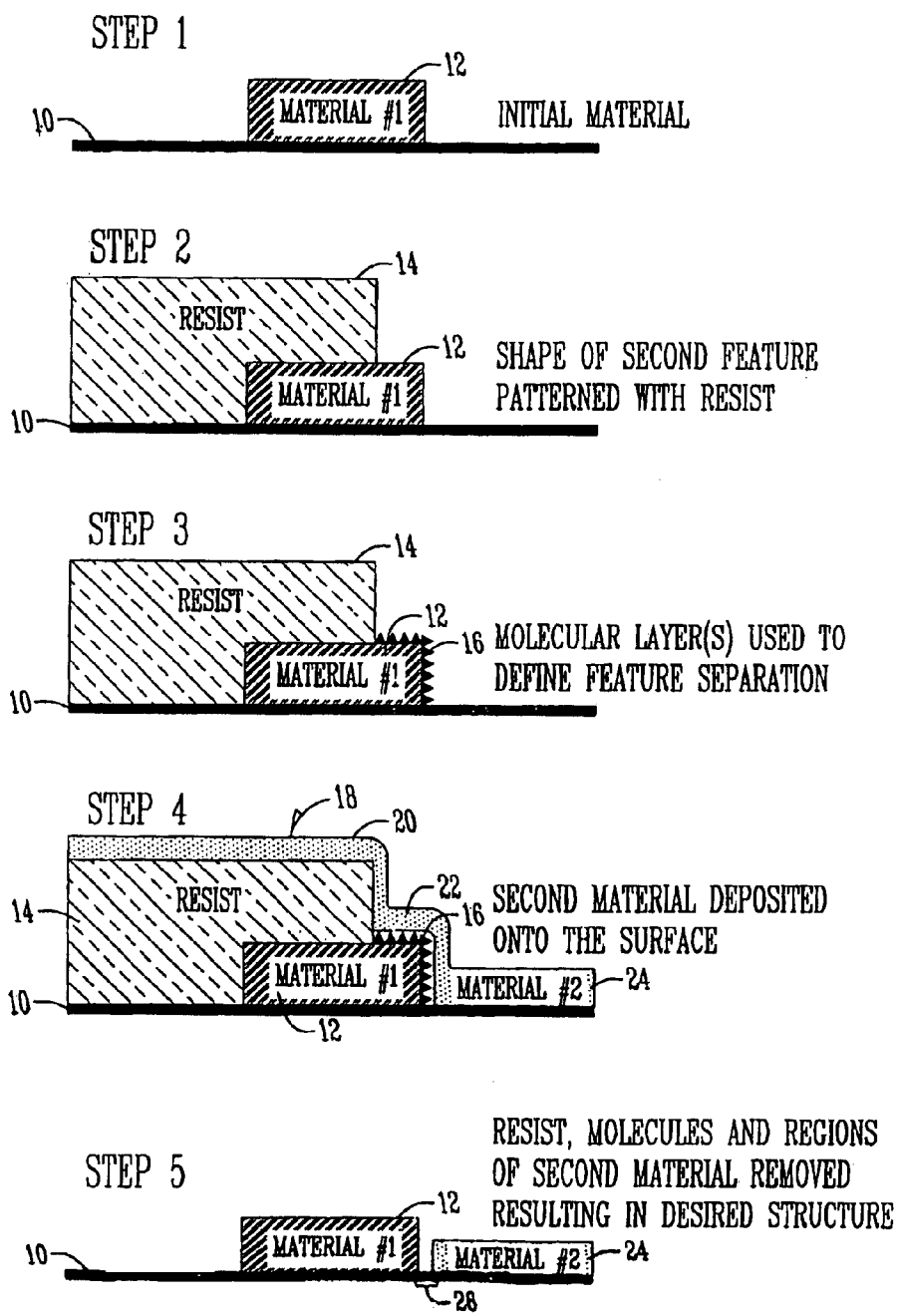
FIG. 1 is a diagram of one step in the fabrication of two features of defined size and shape with a defined separation according to one embodiment of the present invention.

Although specific embodiments are described herein, the present invention is not to be limited to these specific embodiments. FIG. 1 illustrates one embodiment of the methodology of the present invention. In FIG. 1, a substrate 10 is shown. A first material 12 is formed on the surface of the substrate 10 to define a first feature. The first material 12 can be formed through any conventional or otherwise known lithographic technique. In the next step, a resist 14 is applied to a portion of the first material 12. Next, one or more molecular layers 16 are applied to the first material 12. The one or more molecular layers 16 are used to define feature separation between the first feature and a subsequently formed feature. Next, a second material 18 is deposited onto the surface. A portion 20 of the second material 18 is deposited over the resist, a second portion 22 of the second material 18 is deposited over the one or more molecular layers 16, and a third portion 24 of the second material 18 is deposited on the surface of the substrate 10. In the final step of FIG. 1, the resist 14, the one or more molecular layers 16, and the first portion 20 and the second portion 22 of the second material 18 are removed to thereby simultaneously define the shape of a feature 24 formed of the second material while defining a gap 26 between the feature formed by the first material 12 and the feature 24 formed by the second material 24. Thus, in the process of the present invention, a feature of predetermined size and shape that has a spacing with a predefined width from a previously deposited feature is deposited onto a surface.

The present contemplates numerous variations in the specific manner in which these various steps are performed and in the specific materials used. For example, the present invention contemplates that the first feature of the first material 12 can be formed using any number of conventional non-molecular lithographic techniques. Such diverse lithographic techniques can include, but are not limited to electron beam lithography, photolithography, and microcontact printing. Thus, this feature can be fabricated by using a variety of surface patterning methods including, but not limited to, a lift-off process or a deposition followed by a resist patterning, etch, and resist strip steps, or a nano-imprinting of the surface pattern. One skilled in the art having the benefit of this disclosure will also understand that first material 12 can be metal or another type material.

In one methodology, a resist for a second structure is then patterned on the surface for a lift-off process using a lithographic technique. The second feature that is patterned on the surface overlaps with the first pattern in the area that the features are to have a defined separation. The separation is defined using a single layer or multiple layers of molecules that are deposited onto the initially patterned structure. These molecular layers or layer will form only where the first feature and second feature overlap. If a resist or protective material is utilized in the second patterning step, it should be able to tolerate the condition of molecular deposition. As an example, a Shipley LOR 5A resist can be used with a molecular deposition from solution containing alcohol. Another option for the molecular deposition is a vapor process. This reduces the restriction placed on the second resist layer.

Figure 2:
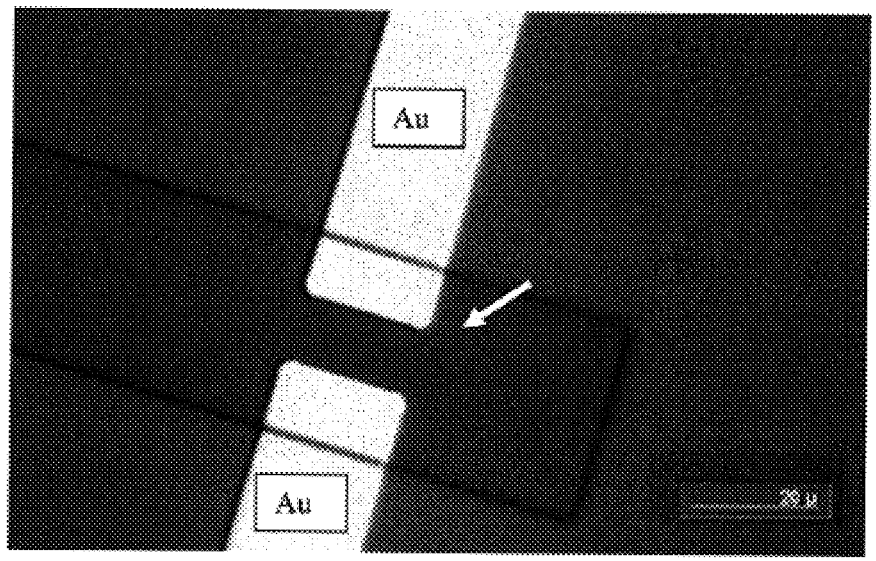
FIG. 2 is an optical image of two gold features that have been defined using conventional photolithography. The white arrow is pointing to the corner of another feature that is only defined with a resist.

In one embodiment of the present invention, an initial pattern of gold is deposited on a silicon wafer using a lift-off process. The resist is removed resulting in a pattern gold structure. A second resist is patterned on the surface. In this embodiment, the resist is a two level stack of Shipley 3012 on top of Shipley LOR 5A. After the initial patterning, the Shipley 3012 is removed by rinsing in acetone. FIG. 2 shows an optical image of the initial gold pattern on a surface and the second pattern defined by the resist. This substrate is then exposed to alkanethiol molecules, which form a monolayer on the surface. By controlling the number of molecular layers and the length of the molecules, the separation between the first feature and second feature can be defined.

Figure 3:
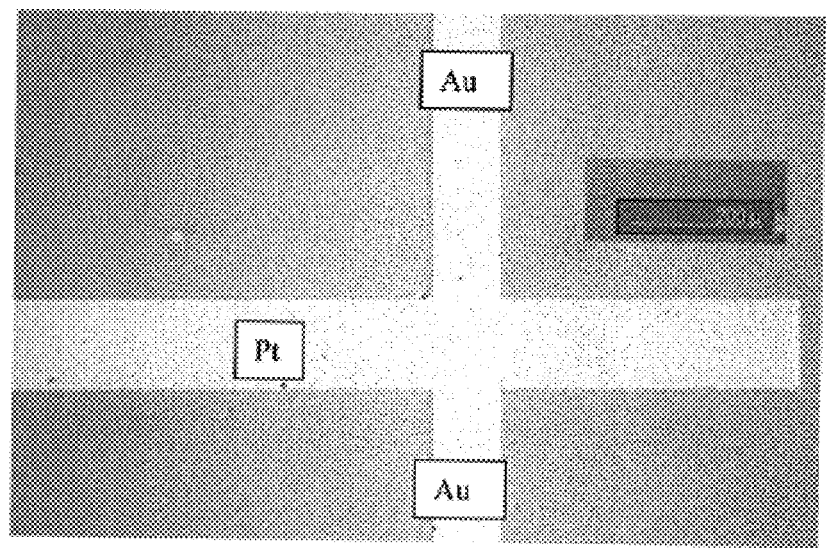
FIG. 3 is an optical image of two gold features and a platinum feature that have been fabricated using the process of the instant invention.
Figure 4:
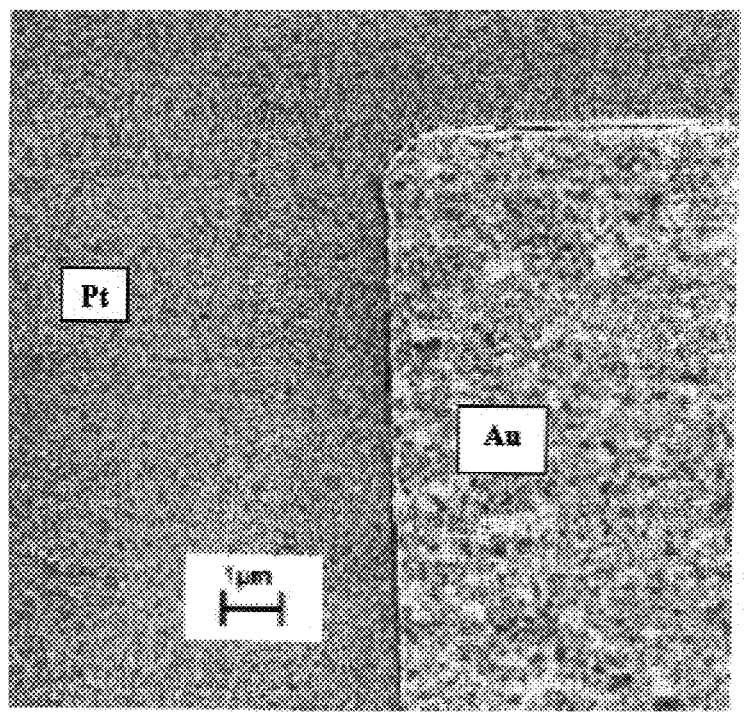
FIG. 4 is a SEM image showing a large area of two features with a tens of nanometer separation.
Figure 5:
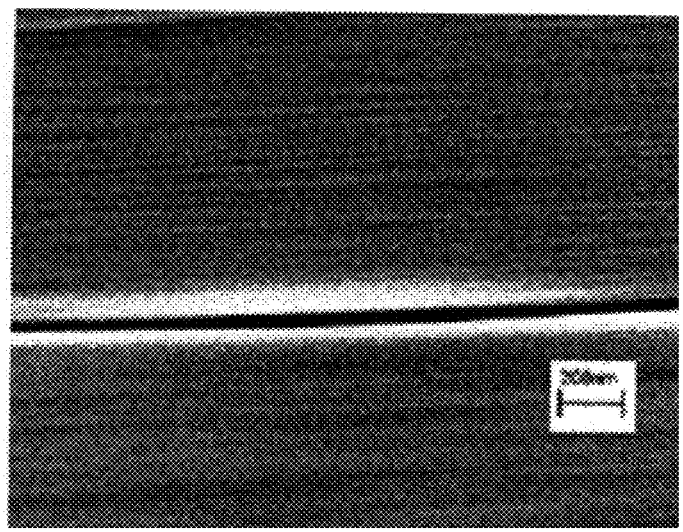
FIG. 5 is a SEM image of the separation between the two electrodes.

After deposition of the molecular layer or layers, a second material is deposited on the surface. This material can be the same or different than the first layer. The resist and unwanted second material is then removed from the surface, resulting in defined features with a defined gap of predetermined width. FIG. 3 shows an optical image of the features after removal of the unwanted materials. FIGS. 4 and 5 show SEM images of the separation between the features.

Given the methodology of the present invention, one skilled in the art will appreciate that the present invention provides for forming nanoscale gaps, including gaps less than 100 nm, preferably under 50 nm, and even more preferably under 20 nm or even 10 nm. As previously explained, the width of these gaps is defined by the number of molecular layers or length of the molecules used within the one or more molecular layers.

While the invention has been particularly shown and described with reference to the preferred embodiments thereof, it will be understood by those skilled in the art that various alterations in form and detail may be made therein without departing from the spirit and scope of the invention. The present invention is not to be limited to the preferred embodiments described herein.

What is claimed is:

1. A method of fabricating a pattern on a surface of a substrate, said pattern comprising a plurality of features, the method comprising applying at least one non-molecular lithographic technique with at least one molecular lithographic technique to simultaneously define a size and shape of at least one of the features of the pattern; wherein the applying the at least one non-molecular lithographic technique with the at least one molecular lithographic technique includes removing both a resist used in the lithographic technique and at least one molecular layers used in the at least one molecular lithographic technique to simultaneously define the size and the shape of the at least one of the features of the pattern.

2. The method of claim 1 wherein the features of the pattern include a first feature of a first material formed from the at least one non-molecular lithographic technique.

3. The method of claim 2 wherein the features of the pattern further include a second feature formed from the at least one molecular lithographic technique.

4. The method of claim 3 further comprising a nanoscale gap between the first feature and the second feature formed from the at least one molecular lithographic technique.

5. The method of claim 4 wherein the at least one molecular lithographic technique uses thickness of at least one molecular layer to define a width of the nano scale gap.

6. The method of claim 5 wherein the at least one molecular layer is used as a liftoff resist.

7. The method of claim 5 wherein the width of the nanoscale gap is less than 100 nm.

8. The method of claim 5 wherein the width of the nanoscale gap is less than 50 nm.

9. The method of claim 5 wherein the width of the nanoscale gap is less than 20 nm.

10. The method of claim 5 wherein the width of the nanoscale gap is less than 10 nm.

11. A method to simultaneously pattern a nanoscale gap between a first feature and a second feature while defining shape of the second feature, comprising:
 forming a first feature of a first material on the surface of the substrate;
 applying a resist to a first portion of the first feature while leaving a second portion of the first feature not covered by the resist;
 applying at least one molecular layer to the second portion of the first feature not covered by the resist;
 depositing a second material;
 removing the resist and the at least one molecular layer to result in a second feature formed from the second material and separated from the first feature by the nanoscale gap, the nanoscale gap having a width defined by a thickness of the at least one molecular layer.

12. The method of claim 11 wherein the step of forming a first feature is performed by a lithographic process.

13. The method of claim 12 wherein the lithographic process is selected from a set comprising: electron beam lithography, photolithography, and microcontact printing.

14. The method of claim 11 wherein the separation distance is controlled by controlling length of molecules forming the at least on molecular layer.

15. The method of claim 11 wherein the at least one molecular layer is a single layer molecular film.

16. The method of claim 11 wherein the at least one molecular layer comprises a plurality of molecular layers, number of molecular layers selected to control the separation distance.

17. The method of claim 11 wherein the width of the nano scale gap is less than 100 nm.

18. The method of claim 11 wherein the width of the nanoscale gap is less than 50 nm.

19. The method of claim 11 wherein the width of the nanoscale gap is less than 20 nm.

20. The method of claim 11 wherein the width of the nanoscale gap is less than 10 nm.

* * * * *

UNITED STATES PATENT AND TRADEMARK OFFICE
CERTIFICATE OF CORRECTION

PATENT NO. : 7,432,039 B2
APPLICATION NO. : 10/979023
DATED : October 7, 2008
INVENTOR(S) : Mc Carty et al.

It is certified that error appears in the above-identified patent and that said Letters Patent is hereby corrected as shown below:

<u>Title Page, Line (54), Line 3 of Title:</u>
After NANOMETER delete "SCALES"
After NANOMETER add --SCALE--

<u>Col. 4, Claim 5, Line 65:</u>
After the delete "nano scale"
After the add --nanoscale--

<u>Col. 6, Claim 14, Line 8:</u>
After least delete "on"
After least add --one--

<u>Col. 6, Claim 17, Lines 15-16:</u>
After of the delete "nano scale"
After of the add --nanoscale--

Signed and Sealed this

Sixteenth Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,432,039 B2
APPLICATION NO. : 10/979023
DATED : October 7, 2008
INVENTOR(S) : Mc Carty et al.

Page 1 of 1

It is certified that error appears in the above-identified patent and that said Letters Patent is hereby corrected as shown below:

<u>Title Page, Line (54), Line 3 and Col. 1, line 3 of Title:</u>
After NANOMETER delete "SCALES"
After NANOMETER add --SCALE--

<u>Col. 4, Claim 5, Line 65:</u>
After the delete "nano scale"
After the add --nanoscale--

<u>Col. 6, Claim 14, Line 8:</u>
After least delete "on"
After least add --one--

<u>Col. 6, Claim 17, Lines 15-16:</u>
After of the delete "nano scale"
After of the add --nanoscale--

This certificate supersedes the Certificate of Correction issued December 16, 2008.

Signed and Sealed this

Sixth Day of January, 2009

JON W. DUDAS
*Director of the United States Patent and Trademark Office*